United States Patent [19]
Leibowitz

[11] Patent Number: 4,944,684
[45] Date of Patent: Jul. 31, 1990

[54] ELECTRICAL JUNCTION BOX AND METHOD FOR ITS MANUFACTURE

[75] Inventor: Joseph D. Leibowitz, Culver City, Calif.

[73] Assignee: TRW, Inc., Cleveland, Ohio

[21] Appl. No.: 212,966

[22] Filed: Jun. 28, 1988

[51] Int. Cl.$^5$ ............................................. H01R 9/09
[52] U.S. Cl. ....................................... 439/76; 439/85; 439/444; 361/414
[58] Field of Search ....................... 439/74, 75, 76, 78, 439/82, 83, 84, 85, 55, 444, 873, 751, 109; 361/399, 412, 414

[56] References Cited

U.S. PATENT DOCUMENTS

| | | | |
|---|---|---|---|
| 3,783,433 | 1/1974 | Kurtz et al. | 439/82 |
| 3,927,925 | 12/1975 | Borsuk | 439/109 |
| 4,255,004 | 3/1981 | Kourimsky et al. | 439/76 X |
| 4,555,638 | 11/1985 | Lobe | 307/10 R |
| 4,736,266 | 4/1988 | Tanibe | 361/414 X |
| 4,812,792 | 3/1989 | Leibowitz | 361/414 X |

FOREIGN PATENT DOCUMENTS

| | | |
|---|---|---|
| 7327573 | 11/1973 | Fed. Rep. of Germany . |
| 2511459 | 9/1976 | Fed. Rep. of Germany . |
| 7522088 | 2/1976 | France . |
| 2022333 | 12/1979 | United Kingdom . |

*Primary Examiner*—Neil Abrams
*Assistant Examiner*—Khiem Nguyen
*Attorney, Agent, or Firm*—Fay, Sharpe, Beall, Fagan, Minnich & Mckee

[57] ABSTRACT

An improved electrical junction box includes a housing, a multilayer printed circuit board supported by the interior of the housing and an array of electrical connectors supported by the exterior of the housing. The electrical connectors make electrical contact with one or more circuit traces in the multilayer circuit board. The circuit traces are of varying thicknesses according to the current levels to be conducted by the traces, thus minimizing the amount of copper required to fabricate the junction box. The circuit traces with the greater thicknesses are positioned in the outer layers of the circuit board to enhance heat dissipation from the circuit board.

15 Claims, 4 Drawing Sheets

ELECTRICAL JUNCTION BOX AND METHOD FOR ITS MANUFACTURE

BACKGROUND OF THE INVENTION

This invention relates generally to automobile electrical systems and, more particularly, to electrical junction boxes for housing some of the components of automobile electrical systems, such as fuses and relays.

Automobile electrical systems typically include a large number of electrical subsystems, such as lighting and signaling, instrumentation, and engine control. These subsystems are generally interconnected by networks of wires and cables, which run throughout the vehicle. Each of these electrical subsystems includes numerous electrical components, such as fuses, relays and connectors. In some automobiles, the fuses and relays are distributed throughout the vehicle, while in others the wires and cables are routed through a single, centrally-located electrical junction box, which houses most or all of the fuses and relays in the vehicle.

A typical "central" electrical junction box includes a housing and an array of male and female electrical connectors supported by the housing. Generally, one side of the housing supports the female electrical connectors and the opposite side of the housing supports the male electrical connectors. The female electrical connectors receive the fuses and relays, while the male electrical connectors receive electrical connectors from the various electrical subsystems of the automobile. The male and female electrical connectors are internally connected within the junction box by a maze of copper-alloy ribbons. The ribbons are stamped from a sheet of copper-alloy metal and then bent at precise angles to provide the proper routing of the ribbons through the interior of the electrical junction box.

An electrical junction box of this type is generally durable and maintenance-free during use, but is difficult to manufacture and redesign. Also, this type of electrical junction box is rather expensive because an excessive amount of copper is generally required to fabricate the ribbons. Accordingly, those skilled in the art have sought to improve upon the design of this type of electrical junction box. For example, United Kingdom Patent No. 2 022 333 discloses an automobile electrical junction box in which several circuit boards are bonded to a rigid carrier base. Each circuit board includes a sheet of copper that is bonded to a sheet of flexible insulating material, preferably with double-sided adhesive tape. The sheet of copper is then etched to form circuit strips. Some of the circuit strips have metal tabs protruding from the edges of the insulating material. These metal tabs are bent so that they extend in a direction generally perpendicular to the circuit boards, to form male electrical connectors. The male electrical connectors receive electrical connectors from the electrical subsystems of the automobile. High current distribution is afforded by a bus bar disposed under the carrier base.

U.S. Pat. No. 4,555,638 to Lobe discloses an automobile electrical junction box having a single printed circuit board. The printed circuit board has a first row of female electrical connectors positioned along an edge of the circuit board. A second row of female electrical connectors, supported by the junction box housing, is positioned adjacent the first row of connectors. The first row of female electrical connectors makes electrical contact with the traces on the circuit board and the second row of female electrical connectors receives electrical connectors from the electrical subsystems of the automobile. The two rows of female electrical connectors form pairs of electrical connectors, which receive fuses for completing the circuits between the traces on the circuit board and the electrical subsystems of the vehicle. High current distribution is afforded by a bus bar disposed under the circuit board.

These types of electrical junction boxes are also rather expensive because an excessive amount of copper is generally required to fabricate the circuit boards. Each circuit board is typically clad with the thickness of copper that is required for the highest current signal that is to be conducted by the circuit board. Unfortunately, such copper layers are then unnecessarily thick for most of the other signals that are to be conducted by the circuit board. One possible solution to this problem is to utilize bus bars for carrying the high current signals. However, a large number of high current signals are typically carried by an electrical junction box and, therefore, a large number of bus bars would be required, thus complicating the manufacturing process of the box. Accordingly, it has become apparent that a new approach to the construction of electrical junction boxes is needed. The present invention is directed to these ends.

SUMMARY OF THE INVENTION

The present invention resides in an improved automobile electrical junction box and a method for its manufacture. Briefly, and in general terms, the improved electrical junction box of the present invention includes a housing, a multilayer printed circuit board supported by the interior of the housing and an array of electrical connectors supported by the exterior of the housing. The electrical connectors make electrical contact with one or more circuit traces in the multilayer circuit board. The circuit traces are of varying thicknesses according to the current levels to be conducted by the traces, thus minimizing the amount of copper required to fabricate the junction box. The circuit traces with the greater thicknesses are positioned in the outer layers of the circuit board to enhance heat dissipation from the circuit board.

In a presently preferred embodiment of the invention, an array of male electrical connectors is supported by a lower section of the housing and an array of female electrical connectors is supported by an upper section of the housing. The female electrical connectors receive metal tabs extending from the undersides of plug-in relays and plug-in fuses, while the male electrical connectors receive electrical connectors from the electrical subsystems of the automobile.

Each of the male and female electrical connectors has a pair of barbs and/or a pair of tabs extending from the sides of the electrical connector, which engage the walls of the housing sections to securely fasten the connectors to the housing. The barbs and/or tabs resist the forces that are exerted on the electrical connectors when inserting or removing the fuses, relays or other electrical connectors from the junction box. Therefore, the housing absorbs most of these forces, which reduces the stresses on the electrical connections between the connectors and the multilayer circuit board, thus improving the reliability of the connections.

Each of the male and female electrical connectors also includes a shank portion that is inserted into a plated hole in the multilayer circuit board to make electrical contact with the appropriate circuit traces in the multilayer circuit board. The shank portion of each electrical connector is slightly wider than the diameter of the plated hole, thus causing the shank portion to be compressed into a hollow middle section to produce a spring force. This spring force provides a gas tight joint between the electrical connector and the plated hole, without soldering. The compression of the shank portion assures a constant supply of stored energy to keep the electrical connector securely fastened in the plated hole and to maintain the gas tight joint.

In the improved method of manufacture of the present invention, the male and female electrical connectors are stamped from sheets of a copper-alloy metal. The male electrical connectors are then inserted into the plated holes from one side of the multilayer circuit board and the female electrical connectors are inserted into the plated holes from the other side of the circuit board. The multilayer circuit board is dipped into a resist bath, on the male connector side of the circuit board, to coat the ends of the male electrical connectors with a resist layer. The multilayer circuit board is then wave soldered on the male connector side of the circuit board. The circuit board is wave soldered only on the male connector side of the circuit board because the female electrical connectors tend to become plugged with the solder, even if coated with a resist layer. However, the solder does migrate through the plated holes to the female connector side of the circuit board, by capillary action, thus providing good electrical connections between the male and female electrical connectors and the plated holes.

After the multilayer printed circuit board has been wave soldered, the resist layer on the ends of the male electrical connectors is removed and the solder connections are examined for integrity. Each side of the printed circuit board is then covered with a conformal coating material, such as paraline, to provide a moisture barrier that will protect the solder joint and prevent corrosion. The upper and lower housing sections are separately molded and pressed into place over the multilayer circuit board, thus forming the improved electrical junction box of the present invention.

It will be appreciated from the foregoing that the present invention represents a significant advance in the field of automobile electrical systems. The electrical junction box of the present invention significantly reduces the amount of copper required to fabricate an electrical junction box, thus drastically reducing its cost. Furthermore, the spring force and the soldered connection between each electrical connector and its plated hole provides redundant joint reliability. The improved method of manufacture of the present invention is relatively inexpensive and can be fully automated using conventional fabrication techniques. In addition, the same manufacturing equipment and tooling can be used to manufacture junction boxes having different circuit routings. Other features and advantages of the present invention will become apparent from the following more detailed description, taken in conjunction with the accompanying drawings, which illustrate, by way of example, the principles of the invention.

DETAILED DESCRIPTION OF THE PREFERRED EMBODIMENT

Figure 1:
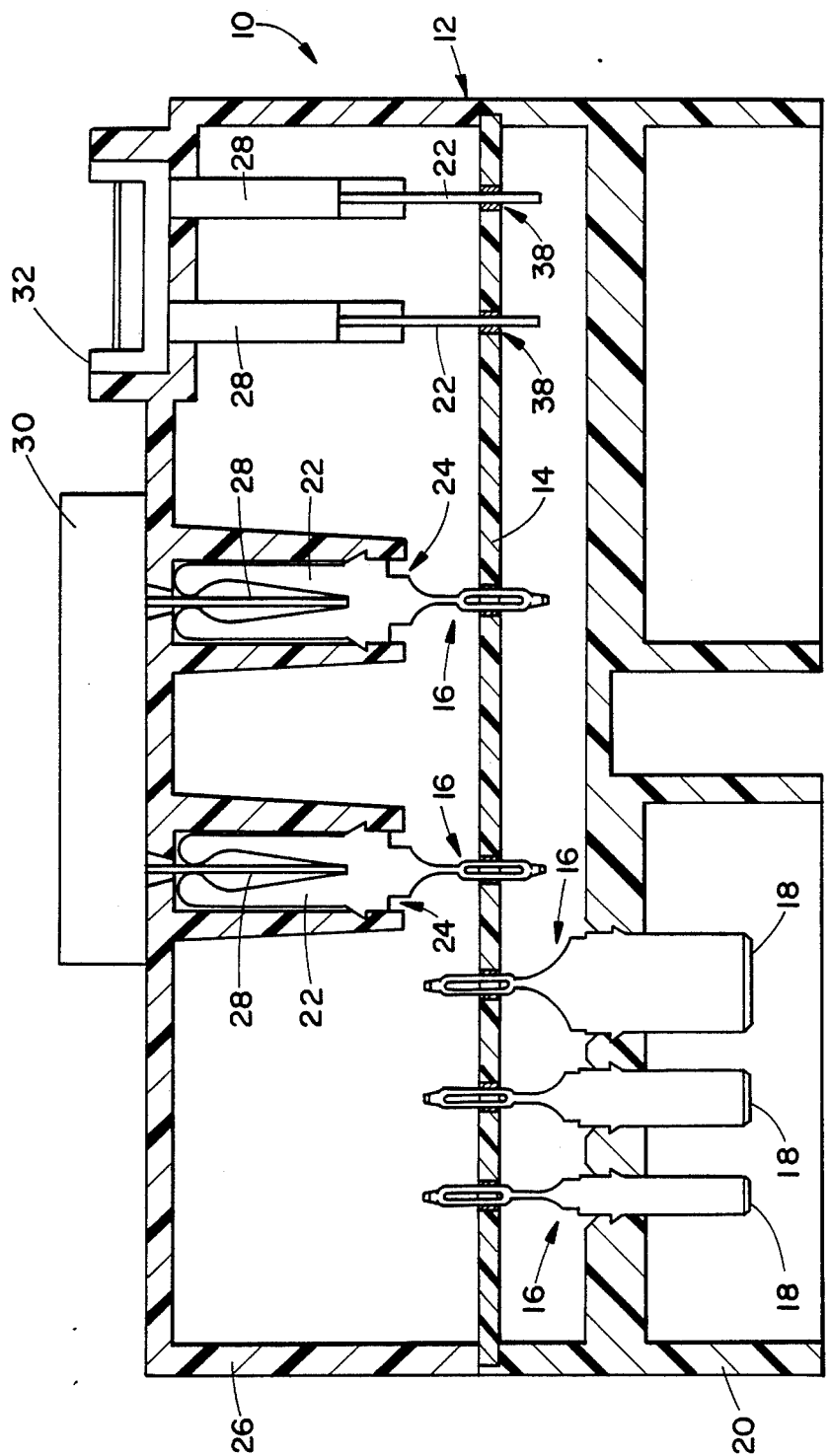
FIG. 1 is a cross-sectional view of an electrical junction box in accordance with the present invention, showing a housing, a multilayer printed circuit board supported by the interior of the housing and an array of male and female electrical connectors supported by the exterior of the housing.

FIG. 1 illustrates an improved automobile electrical junction box 10 in accordance with the present invention. The electrical junction box 10 includes a housing 12, a multilayer printed circuit board 14 supported by the interior of the housing 12 and an array of electrical connectors 16 supported by the exterior of the housing 12. The electrical connectors 16 make electrical contact with one or more circuit traces in the multilayer circuit board 14. The circuit traces are of varying thicknesses according to the current levels to be conducted by the traces, thus minimizing the amount of copper required to fabricate the junction box 10. The circuit traces with the greater thicknesses are positioned in the outer layers of the circuit board 14 to enhance heat dissipation from the circuit board.

In a presently preferred embodiment of the invention, an array of male electrical connectors 18 is supported by a wall of a lower housing section 20 and an array of female electrical connectors 22 is supported in receptacles 24 along the top of an upper housing section 26. The female electrical connectors 22 receive metal tabs 28 extending from the undersides of plug-in relays 30 and plug-in fuses 32, while the male electrical connectors 18 receive electrical connectors from the electrical subsystems of the automobile (not shown).

Figure 2A:
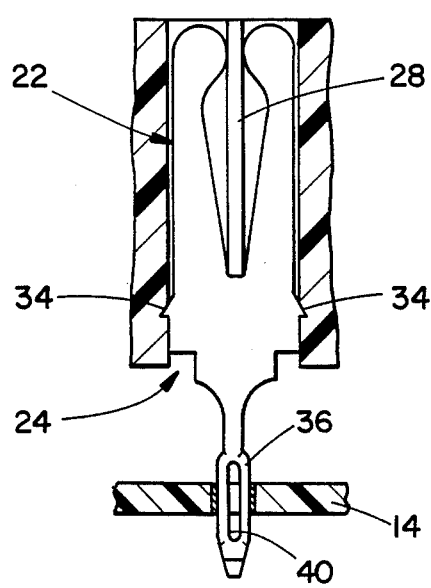
FIG. 2a is an enlarged view of one of the female electrical connectors.
Figure 2B:
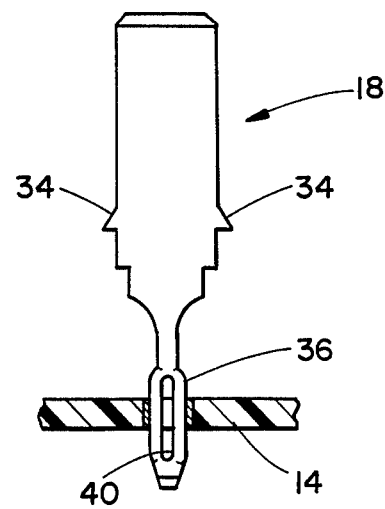
FIG. 2b is an enlarged view of one of the male electrical connectors.

As shown more clearly in FIGS. 2a and 2b, each of the electrical connectors 16 has barbs 34 extending from the sides of the electrical connector, which engage the walls of the housing sections 20, 26 to securely fasten the connectors 16 to the housing 12. The barbs 34 resist the forces that are exerted on the electrical connectors 16 when inserting or removing the fuses 32, relays 30 or other electrical connectors from the junction box. Therefore, the housing 12 absorbs most of these forces, which reduces the stresses on the electrical connections between the connectors 16 and the multilayer circuit board 14, thus improving the reliability of the connections.

As shown in FIGS. 1 and 2, each of the electrical connectors 16 also includes a shank portion 36 that is inserted into a plated hole 38 in the multilayer circuit board 14 to make electrical contact with the appropriate circuit traces in the multilayer circuit board 14. The shank portion 36 of each electrical connector 16 is slightly wider than the diameter of the plated hole 38, thus causing the shank portion to be compressed into a hollow middle section 40 to produce a spring force. This spring force provides a gas tight joint between the electrical connector 16 and the plated hole 38, without soldering. The compression of the shank portion 36 assures a constant supply of stored energy to keep the electrical connector 16 securely fastened in the plated hole 38 and to maintain the gas tight joint.

Figure 3:
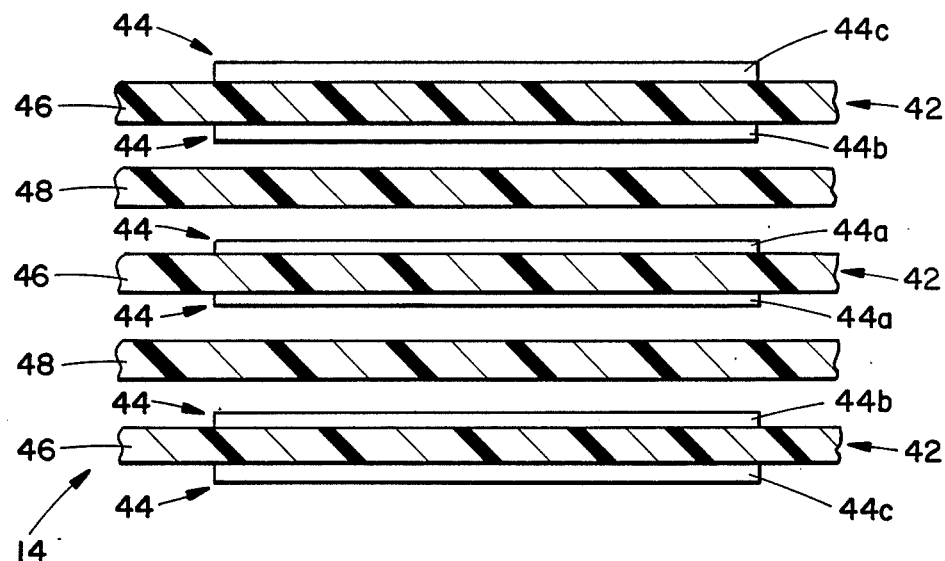
FIG. 3 is an enlarged, fragmentary cross-sectional view of the multilayer printed circuit board.

As shown more clearly in FIG. 3, the multilayer printed circuit board 14 is assembled from three double-sided printed circuit boards 42. Each double-sided circuit board 42 includes a layer of circuit traces 44 disposed on both sides of an insulating board 46, with the circuit traces 44 being formed through a conventional etching process. A sheet of half-cured resin material 48 is sandwiched between each adjacent pair of double-sided circuit boards 42 to provide insulation between the adjacent layers of circuit traces 44. The assembly of double-sided circuit boards 42 and sheets of half-cured resin material 48 are then pressed together and cured to form the multilayer circuit board 14.

The circuit traces 44 in the multilayer circuit board 14 must conduct electrical signals having various current levels. Some of the circuit traces 44 will conduct relatively low current levels, as low as about 10 milliamps, and some of the circuit traces 44 will conduct relatively high current levels, as high as about 100 amps. To enhance heat dissipation from the circuit board 14, the circuit traces 44 that will conduct the higher current levels are positioned in the outer layers of the circuit board 14 and the circuit traces that will conduct the lower current levels are positioned in the inner layers of the circuit board. In a presently preferred embodiment of the invention, the innermost two layers of circuit traces 44a are 4 ounce copper, with a thickness of 0.006 inches, the middle two layers of circuit traces 44b are 6 ounce copper, with a thickness of 0.009 inches, and the outermost two layers of circuit traces 44c are 8 ounce copper, with a thickness of 0.012 inches. The electrical connectors 16 themselves have variable widths and thicknesses, which are selected depending on the particular circuit traces 44 to which the connectors make electrical contact. In addition, two or more electrical connectors 16 can be connected to a single circuit trace 44 when high current levels are to be conducted.

In the improved method of manufacture of the present invention, the male and female electrical connectors 18, 22 are stamped from sheets of a copper-alloy metal. The male electrical connectors 18 are then inserted into the plated holes 38 from one side of the multilayer circuit board 14 and the female electrical connectors 22 are inserted into the plated holes 38 from the other side of the circuit board. The multilayer circuit board 14 is dipped into a resist bath, on the male connector side of the circuit board, to coat the ends of the male electrical connectors 18 with a resist layer. The multilayer circuit board 14 is then wave soldered on the male connector side of the circuit board. The circuit board 14 is wave soldered only on the male connector side of the circuit board because the female electrical connectors 22 tend to become plugged with the solder, even if coated with a resist layer. However, the solder does migrate through the plated holes 38 to the female connector side of the circuit board 14, by capillary action, thus providing good electrical connections between the male and female electrical connectors 18, 22 and the plated holes 38.

After the multilayer printed circuit board 14 has been wave soldered, the resist layer on the ends of the male electrical connectors 18 is removed and the solder connections are examined for integrity. Each side of the printed circuit board 14 is then covered with a conformal coating material, such as paraline, to provide a moisture barrier that will protect the solder joint and prevent corrosion. The upper and lower housing sections 20, 26 are separately molded and pressed into place over the multilayer circuit board 14, thus forming the improved electrical junction box of the present invention.

Figure 4:
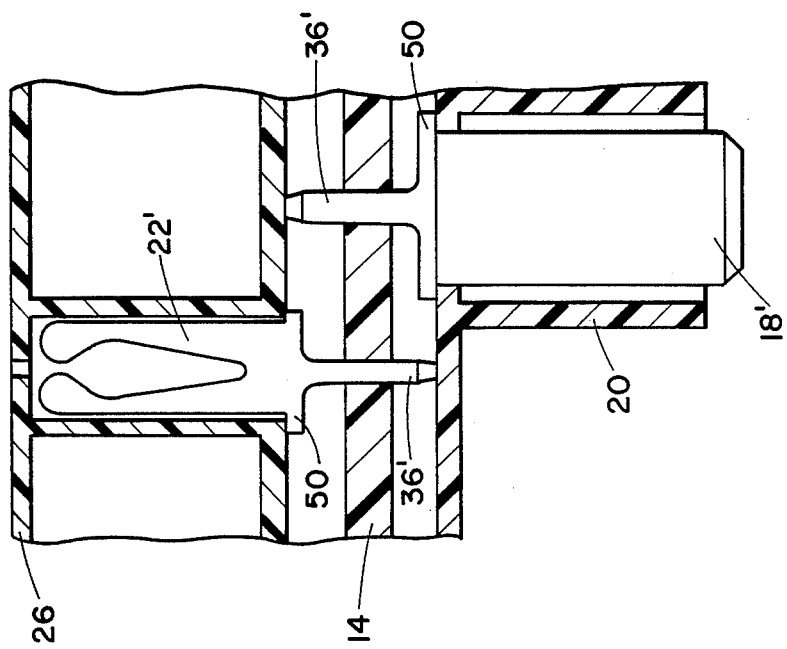

Several alternative embodiments of the male and female electrical connectors 18, 22, for securely fastening the electrical connectors to the junction box housing 12, are illustrated in FIGS. 4–7. FIG. 4 shows male and female electrical connectors 18', 22' having tabs 50 extending from the sides of the electrical connectors, which form shoulders for engaging the interior walls of the housing sections 20, 26. These tabs 50 resist the forces that are exerted on the electrical connectors when removing the fuses 32, relays 30 or other electrical connectors from the junction box 10. Shank portions 36' of the electrical connectors extend to the interior walls of the opposite housing sections 20, 26 to resist the forces that are exerted on the electrical connectors when inserting the fuses, relays or other electrical connectors into the junction box.

Figure 5:
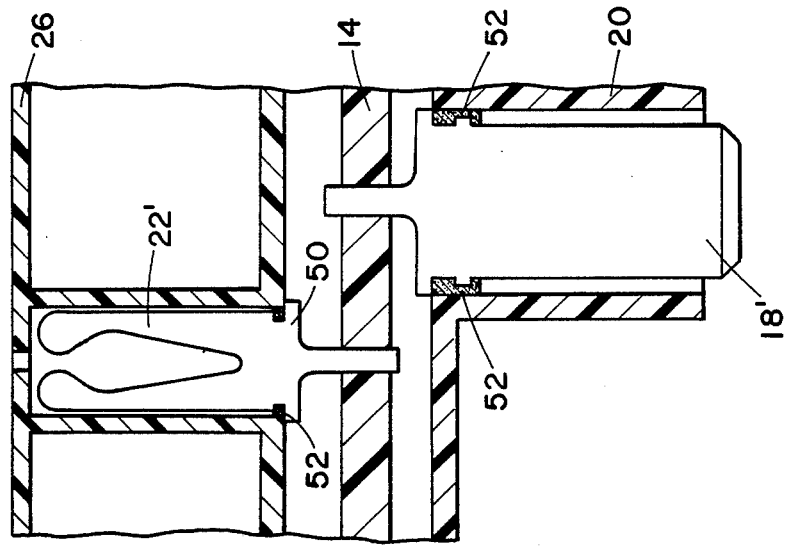
FIGS. 4–7 are enlarged, fragmentary cross-sectional views of the electrical junction of the present invention, showing alternatively preferred embodiments of the male and female electrical connectors.
Figure 7:
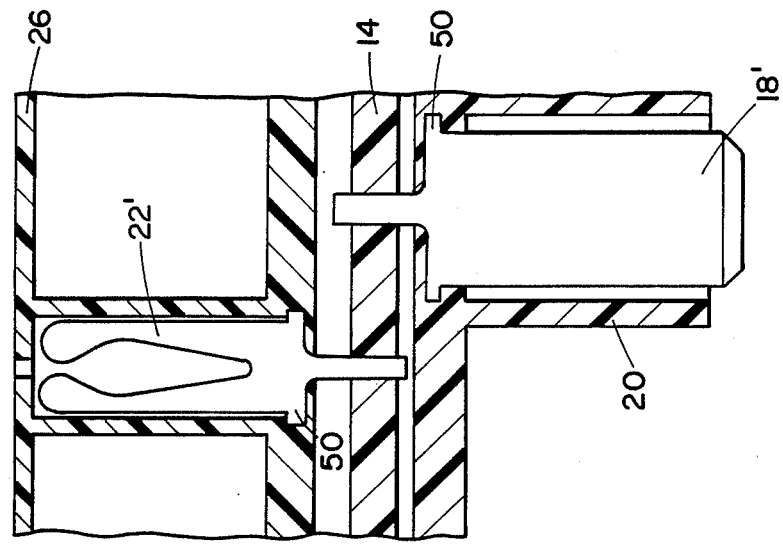
Figure 6:
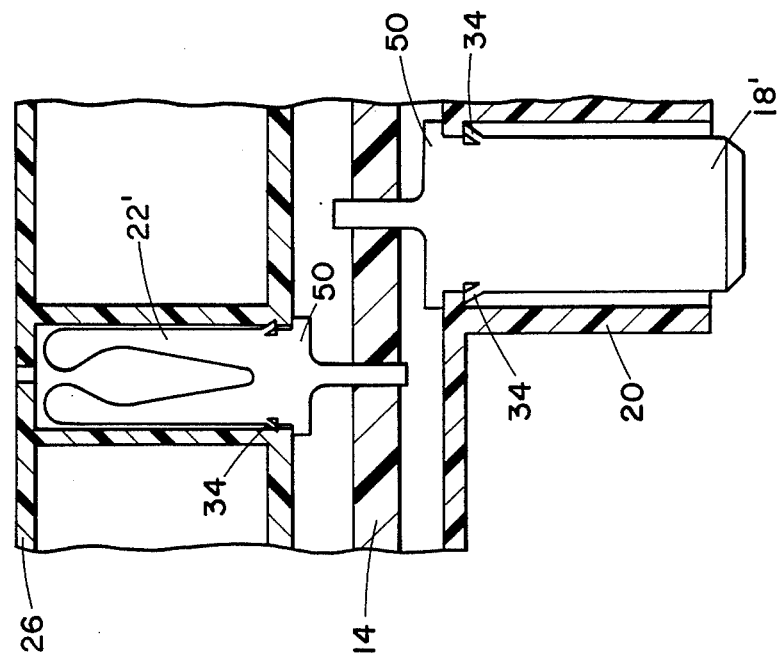

FIG. 5 shows male and female electrical connectors 18', 22' that are securely fastened to the junction box housing 12 with an adhesive 52. Tabs 50 can be utilized in conjunction with the adhesive 52 for added strength. FIG. 6 shows male and female electrical connectors 18', 22' that are securely fastened to the junction box housing 12 with both barbs 34 and tabs 50. FIG. 7 shows male and female electrical connectors 18', 22' that are securely fastened to the junction box housing 12 with tabs 50 that are slightly embedded into the housing sections 20, 26 before the final hardening stage of the housing sections.

It will be appreciated from the foregoing that the present invention represents a significant advance in the field of automobile electrical systems. The electrical junction box of the present invention significantly reduces the amount of copper required to fabricate an electrical junction box, thus drastically reducing its cost. Furthermore, the spring force and the soldered connection between each electrical connector and its plated hole provides redundant joint reliability. The improved method of manufacture of the present invention is relatively inexpensive and can be fully automated using conventional fabrication techniques. In addition, the same manufacturing equipment and tooling can be used to manufacture junction boxes having different circuit routings. Although several preferred embodiments of the invention have been shown and described, it will be apparent that other adaptations and modifications can be made without departing from the spirit and scope of the invention. Accordingly, the invention is not to be limited, except as by the following claims.

I claim:

1. An electrical junction box, comprising:
   a housing;
   a multilayer circuit board supported by the interior of the housing and having a plurality of layers of circuit traces of varying thicknesses for conducting signals of equally varying current levels, thereby minimizing the amount of metal required to fabricate the junction box; and
   an array of electrical connectors supported by the exterior of the housing, each connector making electrical contact with one or more of the circuit traces in the circuit board;
   wherein the layers of circuit traces are arranged in the multilayer circuit board according to the thicknesses of the traces, the layers of circuit traces with the greater thicknesses being the outermost layers of the circuit board and the layers of circuit traces with the lesser thicknesses being the innermost layers, thereby enhancing heat dissipation from the circuit board.

2. The electrical junction box as set forth in claim 1, wherein the housing includes a lower and an upper section with the multilayer circuit board being positioned between the upper and lower sections and male electrical connectors being supported by a wall of the lower housing section and female electrical connectors being supported in receptacles along the top of the upper housing section.

3. The electrical junction box as set forth in claim 2, wherein the female electrical connectors receive metal tabs extending from the undersides of plug-in relays and plug-in fuses and the male electrical connectors receive electrical connectors from wiring external to the electrical junction box.

4. The electrical junction box as set forth in claim 2, wherein each electrical connector includes barbs or tabs extending from the sides of the electrical connector, the barbs or tabs being embedded in the walls of the housing sections to securely fasten the connectors to the housing, whereby the housing resists both insertion and removal forces exerted on the electrical connectors, thereby increasing the reliability of the electrical connections between the electrical connectors and the multilayer circuit board.

5. The electrical junction box as set forth in claim 1, wherein each of the electrical connectors includes a shank portion that is inserted into a plated hole in the circuit board to make electrical contact with the appropriate circuit traces in the circuit board.

6. The electrical junction box as set forth in claim 5, wherein the shank portion of each electrical connector is sightly wider than the diameter of the plated hole, thus producing a spring force that provides a gas tight joint between the electrical connector and the plated hole.

7. The electrical junction box as set forth in claim 1, wherein the circuit board includes three double-sided circuit boards, each adjacent pair of circuit boards being separated by an insulating board.

8. The electrical junction box as set forth in claim 1, wherein the electrical connectors are stamped from a sheet of a copper-alloy metal.

9. An automobile electrical junction box, comprising:
a lower housing section;
an upper housing section;
a multilayer circuit board positioned between the upper and lower housing sections and supported by the interior of one of the housings, the multilayer circuit board having a plurality of layers of circuit traces of varying thicknesses for conducting signals of equally varying current levels, thereby minimizing the amount of metal required to fabricate the junction box;
an array of male electrical connectors supported by a wall of the lower housing section; and
an array of female electrical connectors supported in receptacles along the top of the upper housing section, each electrical connector making electrical contact with one or more of the circuit traces in the circuit board;
wherein the layers of circuit traces are arranged in the multilayer circuit board according to the thicknesses of the traces, the layers of circuit traces with the greater thicknesses being the outermost layers of the circuit board and the layers of circuit traces with the lesser thicknesses being the innermost layers, thereby enhancing heat dissipation from the circuit board.

10. The electrical junction box as set forth in claim 9, wherein the female electrical connectors receive metal tabs extending from the undersides of plug-in relays and plug-in fuses and the male electrical connectors receive electrical connectors from wiring in the automobile.

11. The electrical junction box as set forth in claim 9, wherein each electrical connector includes barbs or tabs extending from the sides of the electrical connector, the barbs or tabs being embedded in the walls of the housing sections to securely fasten the connectors to the housing, whereby the housing resists both insertion and removal forces exerted on the electrical connectors, thereby increasing the reliability of the electrical connections between the electrical connectors and the multilayer circuit board.

12. The electrical junction box as set forth in claim 9, wherein each of the electrical connectors includes a shank portion that is inserted into a plated hole in the circuit board to make electrical contact with the appropriate circuit traces in the circuit board.

13. The electrical junction box as set forth in claim 12, wherein the shank portion of each electrical connector is sightly wider than the diameter of the plated hole, thus producing a spring force that provides a gas tight joint between the electrical connector and the plated hole.

14. The electrical junction box as set forth in claim 9, wherein the circuit board includes three double-sided circuit boards, each adjacent pair of circuit boards being separated by an insulating board.

15. The electrical junction box as set forth in claim 9, wherein the electrical connectors are stamped from a sheet of a copper-alloy metal.

* * * * *